(12) United States Patent
Brown

(10) Patent No.: US 8,701,496 B1
(45) Date of Patent: Apr. 22, 2014

(54) SYSTEMS AND METHODS FOR A PRESSURE SENSOR HAVING A TWO LAYER DIE STRUCTURE

(71) Applicant: Honeywell International Inc., Morristown, MN (US)

(72) Inventor: Gregory C. Brown, Chanhassen, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 13/778,465

(22) Filed: Feb. 27, 2013

(51) Int. Cl.
*G01L 7/08* (2006.01)

(52) U.S. Cl.
USPC ............. 73/715; 73/706; 73/754; 73/756; 73/729.1; 247/419

(58) Field of Classification Search
CPC .................................. G01L 7/08; G01L 7/082
USPC ................. 73/715, 729.1, 754, 756, 706, 727
See application file for complete search history.

(56) References Cited

U.S. PATENT DOCUMENTS

| | | | |
|---|---|---|---|
| 4,790,192 A | 12/1988 | Knecht et al. | |
| 4,846,191 A | 7/1989 | Brockway et al. | |
| 5,515,732 A * | 5/1996 | Willcox et al. | 73/724 |
| 6,148,673 A * | 11/2000 | Brown | 73/721 |
| 6,425,290 B2 * | 7/2002 | Willcox et al. | 73/715 |
| 6,431,003 B1 | 8/2002 | Stark et al. | |
| 6,647,794 B1 * | 11/2003 | Nelson et al. | 73/718 |
| 7,416,910 B2 * | 8/2008 | Foote et al. | 438/48 |
| 7,475,597 B2 * | 1/2009 | Brida et al. | 73/715 |
| 7,775,119 B1 | 8/2010 | Suminto et al. | |
| 8,037,770 B2 * | 10/2011 | Larson et al. | 73/714 |
| 8,065,917 B1 * | 11/2011 | Brown et al. | 73/706 |
| 8,215,176 B2 | 7/2012 | Ding et al. | |
| 8,230,743 B2 * | 7/2012 | Wade et al. | 73/706 |
| 8,253,230 B2 * | 8/2012 | Janzen et al. | 257/686 |
| 8,487,387 B2 * | 7/2013 | Lin et al. | 257/415 |
| 8,536,626 B2 * | 9/2013 | Brown et al. | 257/253 |
| 2003/0205089 A1 * | 11/2003 | Nelson et al. | 73/715 |
| 2008/0016683 A1 * | 1/2008 | Brida et al. | 29/739 |
| 2010/0043563 A1 * | 2/2010 | Kageyama et al. | 73/722 |
| 2010/0251825 A1 * | 10/2010 | Kurtz et al. | 73/721 |

(Continued)

OTHER PUBLICATIONS

Brown, "Integrated Referenc Vacuum Pressure Sensor With Atomic Layer Deposition Coated Input Port", "U.S. Appl. No. 13/778,445, Client Case No. H0038101-5869, filed Feb. 27, 2013", Feb. 27, 2013, pp. 1-25.

*Primary Examiner* — Savitr Mulpuri
(74) *Attorney, Agent, or Firm* — Fogg & Powers LLC

(57) ABSTRACT

Systems and methods for a pressure sensor are provided, where the pressure sensor comprises a housing having a high side input port that allows a high pressure media to enter a high side of the housing and a low side input port that allows a low pressure media to enter a low side of the housing when the housing is placed in an environment containing the high and low pressure media; a substrate mounted within the housing; a stress isolation member mounted to the substrate; a die stack having sensing circuitry bonded to the stress isolation member; a low side atomic layer deposition (ALD) applied to surfaces, of the substrate, the stress isolation member, and the die stack, exposed to the low side input port; and a high side ALD applied to surfaces, of the stress isolation member and the die stack, exposed to the high side input port.

9 Claims, 4 Drawing Sheets

(56) References Cited

U.S. PATENT DOCUMENTS

2010/0281994 A1* 11/2010 Brown et al. ............ 73/729.1
2012/0042734 A1* 2/2012 Wade et al. ............. 73/862.381
2013/0098160 A1* 4/2013 Rozgo et al. .................. 73/723
2013/0276544 A1* 10/2013 Potasek et al. ................ 73/715

* cited by examiner

SYSTEMS AND METHODS FOR A PRESSURE SENSOR HAVING A TWO LAYER DIE STRUCTURE

BACKGROUND

Silicon pressure sensors offer multiple benefits that include small size, good quality, and stable performance. Further, since multiple identical sensors can be fabricated simultaneously on a single wafer, silicon pressure sensors are cost effective to manufacture. However, in certain environments, the pressure media can corrode components on the sensing die or the silicon sensing die itself. To prevent the pressure media from corroding the sensing die, the sensing die may be isolated from the pressure media. To isolate the pressure media, the sensing die is typically placed within an oil filled diaphragm system, where a metal isolating diaphragm is exposed to the pressure media on one side and to an oil filled chamber on the other. The pressure sensing portion of the silicon pressure sensor is surrounded by this oil, such that a change in the oil pressure results in a change on the sensing element of the silicon pressure sensor. However, an oil filled isolator system adds significant size to the pressure sensor structure compared to the size limit imposed by the silicon pressure sensing die.

Further, in certain implementations, where the pressure media is air, the silicon can be directly exposed to the air. In one type of pressure sensor, piezo-resistive silicon structures sense the strain in a pressure sensing diaphragm. The surface containing these piezo-resistive elements also contains metalized traces and wire bond pads. When air is the pressure media, the side of the silicon containing metalized areas for connecting the piezo-resistive elements can be exposed to air borne humidity. The humidity can result in current leakage between the metalized areas that produces errors in pressure measurements.

SUMMARY

Systems and methods for a pressure sensor having a two layer die structure are provided. In certain embodiments a pressure sensor comprises a housing comprising a high side input port configured to allow a high pressure media to enter a high side of the interior of the housing and a low side input port configured to allow a low pressure media to enter a low side of the interior of the housing when the housing is placed in an environment containing the high pressure media and the low pressure media; and a substrate securely mounted within the housing. Also, the pressure sensor comprises a stress isolation member mounted to the substrate, wherein a channel extends from an end of the low side input port through the substrate and the stress isolation member; and a two layer die stack bonded to the stress isolation member, the two layer die stack comprising isolated sensing circuitry. Further, the pressure sensor comprises a low side atomic layer deposition applied to surfaces of the substrate, the stress isolation member and the two layer die stack that are exposed to the low side input port; and a high side atomic layer deposition applied to surfaces of the stress isolation member and the two layer die stack that are exposed to the high side input port.

DRAWINGS

Understanding that the drawings depict only exemplary embodiments and are not therefore to be considered limiting in scope, the exemplary embodiments will be described with additional specificity and detail through the use of the accompanying drawings, in which.

Figure 1:
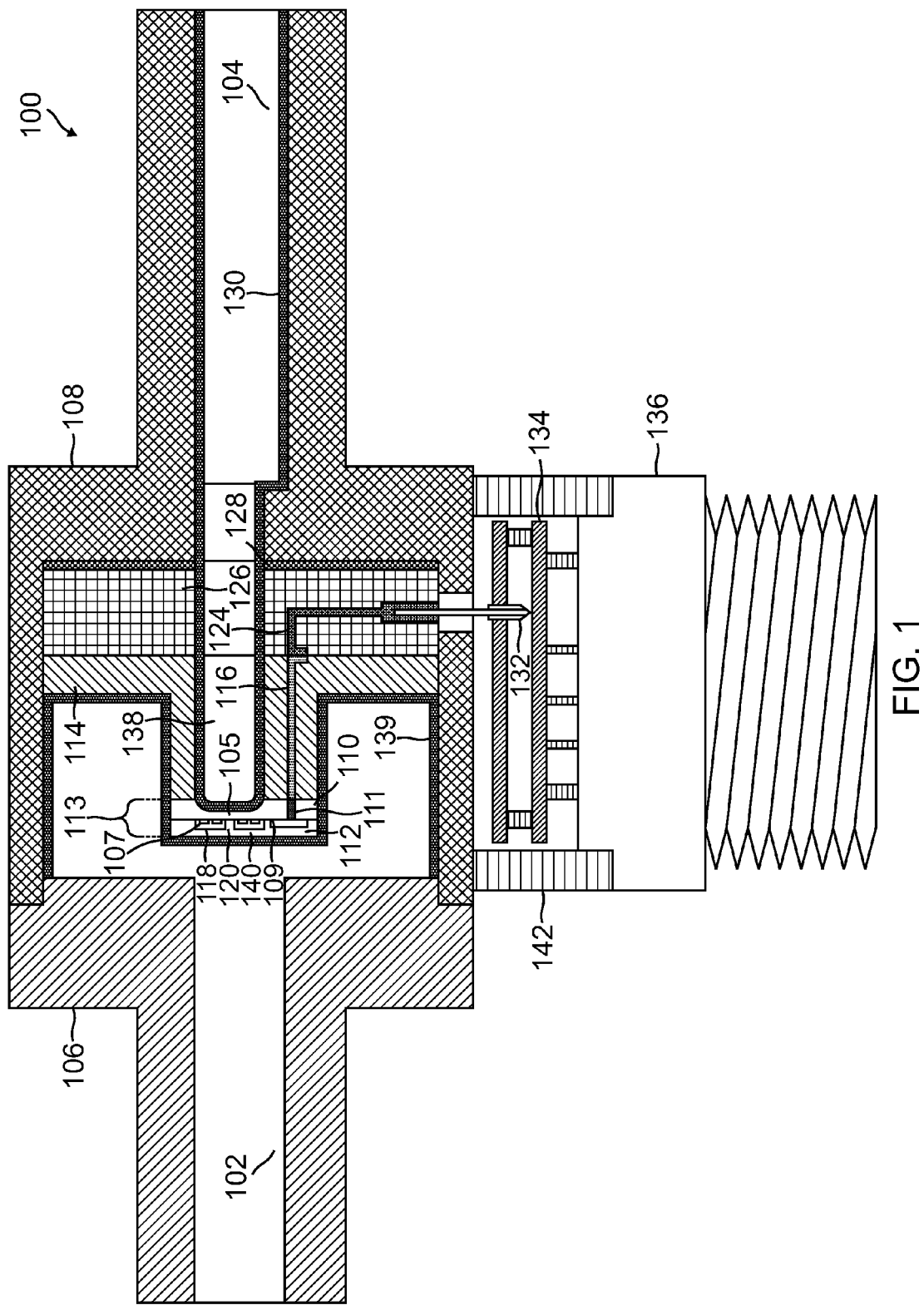
FIG. 1 is a cross sectional diagram of a pressure sensor in one embodiment described in the present disclosure.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

Embodiments described in the present disclosure protect the silicon die and sensing circuitry formed on the silicon die from damaging effects of the pressure media such as corrosion and humidity caused current leakage. To protect a silicon pressure sensor, the sensing circuitry is formed between two silicon pressure sensing dies to form a two layer die stack. The two layer die stack is mounted on a silicon matched—low temperature co-fired ceramic (SM-LTCC) stress isolation member such as a pedestal. The two layer die stack structure provides two pressure sensing diaphragms, a high pressure sensing diaphragm and a low pressure sensing diaphragm. The two layer die stack contains an internal cavity between the high pressure sensing diaphragm and the low pressure sensing diaphragm. The internal cavity isolates sensing circuitry from the pressure media, which sensing circuitry includes connective pads, metalized traces, and piezo-resistive elements. The two layer die structure also includes a center post connecting the high pressure sensing diaphragm to the low pressure sensing diaphragm, where the center post transfers the force caused by the deflection of the high pressure sensing diaphragm and the low pressure sensing diaphragm between one another. In this way differential pressures applied to either the high pressure sensing diaphragm or the low pressure sensing diaphragm are sensed by the piezo-resistive elements on one of diaphragm surfaces exposed to the internal cavity. Electrical connections are made to the piezo-resistive elements through connections with through-die vias. By locating the sensing circuitry within an internal cavity, the sensing circuitry is isolated from detrimental effects of the pressure media.

In an additional embodiment, the two layer die stack is also protected from both low and high pressure media by an atomic layer deposition formed on surfaces of the two layer die stack that are not otherwise isolated from the low and high pressure media. For example, a metal oxide coating like Alumina or Titanium Oxide is deposited on the exposed surfaces within the pressure sensing device to minimize sensor performance degradation. This configuration can be used for gauge or differential pressure applications. It can also be configured as an absolute pressure sensor when one of the ports is sealed to contain a vacuum. Further, by eliminating oil as an isolation media, the size of the pressure sensor can be reduced.

FIG. 1 is a cross-section view of a pressure sensing device 100. The pressure sensing device 100 is capable of measuring the differential pressure between separate media or gauging the pressure in a media. When the pressure sensing device 100 senses pressure in different pressure medias, the different pressure medias may be composed of air, liquid, or both air and liquid. To sense the pressure of the different pressure medias, the pressure sensing device 100 includes a high side input port 102 and a low side input port 104, wherein the high side input port 102 allows a high pressure media to enter a high side housing 106 and the low side input port 104 allows a low pressure media to enter the low side housing 108. As used herein, the high pressure media refers to a media having a pressure that is higher than the low side pressure media. However, in certain exemplary implementations, the low pressure media may have a higher pressure than the high pressure media. Also, in one particular exemplary implementation, one of the high side or the low side is sealed off to contain a reference vacuum such that the pressure sensing device 100 functions as an absolute pressure gauge. In certain other embodiments, the pressure sensing device 100 finds the differential pressure between the high pressure media and the low pressure media. Alternatively, the pressure sensing device 100 uses the pressure of one of the high or low pressure media as a reference to gauge the pressure in the other media. Further, the high side housing 106 is coupled to the low side housing 108 to encapsulate sensing components of the pressure sensing device 100 to protect the components from environmental influences that can damage the pressure sensing device 100 or affect the performance of the pressure sensing device 100.

In certain embodiments, to measure the pressure between the high pressure media that enters the high side input port 102 and the low pressure media that enters the low side input port 104, a pressure sensing device 100 includes a sensing die 110 having a diaphragm 105 formed therein. To form the diaphragm 105 in the pressure sensing device 100, a portion of the sensing die 110 is removed to form a recessed portion of the sensing die 110, where the recessed portion is a section of the sensing die 110. By recessing a portion of the sensing die 110, a diaphragm is formed that is thinner than other portions of the sensing die 110 such that the diaphragm 105 is able to move in response to pressure differences on the different sides of the diaphragm 105.

In at least one implementation, the sensing die 110 is a piezo-resistive silicon pressure sensing die, where sensing circuitry 107, which includes piezo-resistive silicon structures, is formed on a circuitry side 109 of the silicon diaphragm 105 and strain in the diaphragm 105 affects the performance of the sensing circuitry 107. In at least one embodiment, as the high pressure media enters the high side housing 106 through the high side input port 102 and the low pressure media enters the low side housing 108 through the low side input port 104, both the low pressure media and the high pressure media exert a force on the sensing die 110. The pressure difference between the low pressure media and the high pressure media causes deflections in the diaphragm 105 on the sensing die 110. For example, if the high pressure media and the low pressure media are equal in pressure, then the high pressure media and the low pressure media exert the same pressure on the diaphragm 105, but from opposite sides of the diaphragm 105. Thus when the pressure difference is zero, the diaphragm 105 does not deflect. Further, when the high pressure media has a greater pressure than the low pressure media, then the high pressure media applies a greater force against the diaphragm 105 than the low pressure media. Due to the force applied by the high pressure media, the diaphragm 105 deflects toward the low side input port 104, which deflection of the diaphragm 105 strains the sensing circuitry 107 formed on the diaphragm 105.

In certain environments, the high side housing 106 and the low side housing 108 may be subjected to stress that may affect the components of the pressure sensing device 100 that are located within the combination of the high side housing 106 and the low side housing 108. While some of the components within the housing may be minimally affected by stress, strain on piezo-resistive silicon structures in the sensing circuitry 107 located on the circuitry side 109 of the sensor die 110, caused by stress on the pressure sensing device 100, can negatively affect the accuracy of pressure measurements made by the pressure sensing device 100. For example, external strain on the pressure sensing device 100 may propagate through the various components of the pressure sensing device 100 and strain the sensor die 110 in a way that is similar to the strain applied to the diaphragm 105 of the sensor die 110 by either the high pressure media or low pressure media. Strain on the diaphragm 105 leads to bias in pressure measurements derived from the sensor die 110. In certain implementations, to isolate the sensor die 110 from stress on the pressure sensing device 100 or other components in the sensing device 100, the sensor die 110 is mounted on a stress isolation member 114. The stress isolation member 114 isolates the sensor die 110 from strain applied to the pressure sensing device 100 or caused by other components within the pressure sensing device 100. In one particular example, the stress isolation member 114 may include a pedestal having the sensor die 110 mounted there on, where the pedestal structurally isolates the sensor die 110 within the pressure sensing device 100 from physical forces that affect the pressure sensing device 100 or other components of the pressure sensing device 100.

In certain embodiments, to further prevent strain from affecting the precision of pressure measurements by the sensor die 110, the stress isolation member 114 is manufactured from a material that has a similar coefficient of thermal expansion (CTE) as the sensor die 110. For example, when the sensor die 110 is fabricated from silicon, the stress isolation member 114 is fabricated from a material having substantially the same CTE as silicon. Thus, when the stress isolation member 114 and/or the sensor die 110 change in size due to changes in thermal energy, the stress isolation member 114 and the sensor die 110 expand at substantially the same rate to prevent thermal expansion from applying stress to the piezo-resistive elements formed on the sensor die 110. In at least one exemplary implementation, the sensor die 106 is fabricated from a silicon matching low temperature co-fired ceramic (SM-LTCC). In further embodiments, when the stress isolation member 114 is fabricated, the sensor die 110 is bonded to the stress isolation member 114 using a thermoelectric bonding process or other process for bonding the sensor die 110 to the stress isolation member 114.

In certain embodiments, the stress isolation member 114 is formed on a substrate 126. The substrate 126 may be fabricated from an alumina support material or other brazeable material. In at least one exemplary implementation, the substrate 126 and stress isolation member 114 are securely mounted within the low side housing 108. To securely mount the substrate 126 and any attached components within the low side housing 108, the substrate 126 is attached to the low side housing 108 with a braze 128. As the substrate 126 is securely attached to the low side housing 108, pressure media that enters the low side port 104 may come into contact with a side of the substrate 126 that is on the opposite side of the substrate from the stress isolation member 114. To allow the pressure media to pass through the substrate 126 and the stress isolation member 114 so that the pressure media can contact the diaphragm 105 of the sensor die 110, a channel 138 is formed through the substrate 126 and the stress isolation member 114. When the stress isolation member 114 includes a pedestal, the channel 138 extends through the pedestal. The sensor die 110 is mounted to the stress isolation member 114 such that one side of the diaphragm 105 faces an opening of the channel 138 in the stress isolation member 110 and the circuitry side 109 of the sensor die 110 is not exposed to the channel 138.

In at least one implementation, to facilitate electrical connections between the sensing circuitry 107 on the diaphragm 105 of the sensor die 110 and external circuitry, a metalized via 111 is formed through the sensor die 110. Further, during the fabrication of the stress isolation member 114, stress isolation embedded traces 116 are formed within the stress isolation member 114 and substrate embedded traces 124 are formed within the substrate 126. The sensing circuitry 107 formed on the sensor die 110 are electrically connected to the metalized vias 111. The sensor die 110 is mounted to the stress isolation member 114 such that the metalized vias 111 contact the stress isolation embedded traces 116 in the stress isolation member 110. Further, the stress isolation embedded traces 116 contact substrate embedded traces 124. The substrate embedded traces 124 extend through the substrate and electrically contact an interconnect 132 that extends through a side wall of either the low side housing 108 or the high side housing 106. The interconnect 132 extends through the side wall and contacts front end circuitry 134 mounted on a circuit wafer. The front end circuitry 134 electrically connects to an external connector that connects the pressure sensing device 100 to an external system. The front end circuitry 134 includes electronics that, in part, function to control the input to the electrical elements on the sensor die 110. For example, the front end circuitry 134 includes analog to digital converters, digital to analog converters, multi chip modules and the like. In at least one implementation, the front end circuitry 134 performs functionalities such as pressure output characterization, output signal conditioning, and the like.

In certain implementations, there are multiple stress isolation embedded traces 116 and substrate embedded traces 124, where each stress isolation embedded trace 116 is associated with a substrate embedded trace 124 and each associated pair of stress isolation embedded traces 116 and substrate embedded traces 124 is likewise associated with an individual metalized via 111 formed in the sensor die 110. Each combination of a stress isolation embedded trace 116, substrate embedded trace 124 and metalized via 111 forms a different electrical connection between the front end circuitry 134 and the sensing circuitry 107 formed on the sensor die 110. Thus, as the performance of the sensing circuitry 107 on the sensor die 110 changes in response to strain on the diaphragm 105, the sensing circuitry 107 is driven through the front end circuitry 134 such that changes in the performance of the sensing circuitry 107 are communicated to an external system through the external connector 136.

In at least one embodiment, the sensing die 110 and accompanying diaphragm 105 may be fabricated from silicon or other similar material. Also, the sensing die 110, piezo-resistive elements, and accompanying circuitry formed on the sensing die 110 may be susceptible to damage from the pressure media. For example, if the sensing die were to come into contact with the pressure media for a substantial period of time, the pressure media could corrode the sensing die 110 and affect the operation of the sensing circuitry 107 formed on the sensing die 110. The corrosion and operational affects may even cause the pressure sensing device 100 to fail or function incorrectly. In one particular example, where the pressure media is air, the air may contain humidity, which humidity may cause hygroscopic components in the pressure sensing device 100 to expand and apply strain to the sensing die 110. Further, the humidity may also cause current leakage between metalized paths formed on the sensing die 110. To prevent damage to the sensing die 110 that can be caused by pressure media, sensing circuitry on the sensing die 110 is isolated from coming in contact with either the low or the high pressure media.

In certain embodiments, to isolate the sensing circuitry from both the high pressure media and the low pressure media, the sensing circuitry is placed within an internal cavity 118 between a high pressure sensing die 112 and the sensing die 110, where the sensing die 110 functions as a low pressure sensing die 110. The high pressure sensing die 112 and the low pressure sensing die 110 are hermetically bonded together such that moisture in either the high pressure media or the low pressure media is unable to access the internal cavity 118 containing the sensing circuitry. When the high pressure sensing die 112 and the low pressure sensing die 110 are bonded together, the high pressure sensing die 112 and the low pressure sensing die 110 form a two layer die stack 113. In at least one exemplary implementation, the high pressure sensing die 112 and the low pressure sensing die 110 are bonded to one another through a diffusion bonding process.

As illustrated in FIG. 1, sensor die 110, which in certain embodiments has the sensing circuitry 107 formed thereon, functions as the low pressure sensing die 110. In an alternative embodiment, the sensing circuitry 107 may be formed on the high pressure sensing die 112. The low pressure sensing die 110 includes a low pressure diaphragm 105. The low pressure diaphragm 105 reacts directly to forces applied by the low pressure media that enters the pressure sensing device 100 through the low pressure input port 104. Similarly, the high pressure sensing die 112 includes a high pressure diaphragm 140. The high pressure diaphragm 140 is formed in a similar manner to the low pressure diaphragm 105. The high pressure diaphragm 140 reacts directly to forces applied by the high pressure media that enters the pressure sensing device 100 through the high pressure input port 102. In at least one further implementation, the low pressure diaphragm 105 and the high pressure diaphragm 140 are physically connected to each other through a center post 120. The center post 120 is a force commutating member between the high pressure diaphragm 140 and the low pressure diaphragm 105. When a force is applied on the low pressure diaphragm 105 by the low pressure media, the low pressure diaphragm 105 moves in response to the applied force. Because the low pressure diaphragm 105 is in contact with the center post 120, the movement of the low pressure diaphragm 105 exerts a force on the center post 120. Because the center post 120 is in contact with the high pressure diaphragm 140, the force exerted on the center post 120 by the low pressure diaphragm 105 is transferred through the center post 120 and applied to the high pressure diaphragm 140. Likewise, when a force is applied on the high pressure diaphragm 140 by the high pressure media, the high pressure diaphragm 140 moves in response to the applied force. Because the center post is in contact with both the low pressure diaphragm 105 and the high pressure diaphragm 140, the force exerted on the center post 120 by the high pressure diaphragm 140 is transferred through the center post 120 and applied to the low pressure diaphragm 105. Because forces applied by either the high pressure media or the low pressure media on either the high pressure diaphragm 140 or the low pressure diaphragm 105 affect the movement of low pressure diaphragm 105 containing the sensing circuitry, the low pressure diaphragm 105 moves according to the differences between the high pressure media and the low pressure media. Thus, the sensing circuitry within the internal cavity 118 is able to provide pressure measurements representing the pressure difference between the high pressure media and the low pressure media.

In certain embodiments, the stress isolation member 114 may be manufactured from a hygroscopic material such as silicon, SM-LTCC, and the like. When a stress isolation member 114 is manufactured from a hygroscopic material, the stress isolation member 114 expands as the stress isolation member 114 absorbs moisture in either the high pressure media that enters the pressure sensing die 100 through the high side port 102 or the low pressure media that enters the pressure sensing die 100 through the low side port 104. If the stress isolation member 114 is exposed to moisture in either the low pressure media or the high pressure media, the expansion of the stress isolation member 114 may expand in such a way that the piezo-resistive elements in the sensing circuitry on the low pressure sensor die 110 become strained, thus causing a bias in the measurements produced by the piezo-resistive elements. Further, certain pressure media can be corrosive to the two layer die stack 113 such that pressure media can damage the low pressure sensing die 110 and the high pressure sensing die 112 as the low pressure sensing die 110 and the high pressure sensing die 112 are exposed to the pressure media.

In certain embodiments, the stress isolation member 114 is protected from moisture in the pressure media and the low pressure sensing die 110 and the high pressure sensing die 112 are protected from possibly damaging substances in the pressure media by an atomic layer deposition (ALD) coating 126 and 139. For example, surfaces of the two layer die stack 113 and the stress isolation member 114 that can potentially be exposed to high pressure media are coated with a high pressure ALD coating 139. Likewise, surfaces of the two layer die stack 113, the stress isolation member 114, and the substrate 126 that can potentially be exposed to low pressure media are coated with a low pressure ALD coating 130. In certain implementations, both the high pressure ALD coating 139 and the low pressure ALD coating 130 are an atomic layer deposition of a metal oxide. For example the metal oxide may be an alumina, a titanium oxide, and the like. In at least one embodiment, both the low pressure ALD coating 130 and the high pressure ALD coating 139 are deposited on the surfaces of components within the pressure sensing device 100 before the components are mounted within the low side housing 108. Alternatively, both the low pressure ALD coating 130 and the high pressure ALD coating 139 are applied to the components within the pressure sensing device 100 after the components are mounted in the low side housing 108 but before the low side housing 108 is joined to the high side housing 106. For example, when the substrate 126, stress isolation member 114, and two layer stack 113 are secured within the low side housing 108, both of the high pressure ALD coating 139 and the low pressure ALD coating 130 are applied to all the exposed interior surfaces of the low side housing 108. When both of the high pressure ALD coating 139 and the low pressure ALD coating 130 are applied to the surfaces within the low side housing 108, the low side housing 108 and the high side housing 106 are joined together. Also, by coating the internal surfaces of the low side housing 108 that are exposed through the low side input port 104 with the low pressure ALD coating 130, the low pressure ALD coating 130 is applied over the braze 128. The application of the low pressure ALD coating 130 over the braze 128 may eliminate the need for O-ring seals within the pressure sensing device 100, which O-ring seals may fail during high-temperature operation.

As described above, the high pressure ALD coating 139 and the low pressure ALD coating 130 protect the components of the pressure sensing device 100 from substances in the pressure media that may affect the performance of the pressure sensing device 100. Also, the placing of sensing circuitry within an internal cavity 118 formed by a high pressure sensing die 112 and a low pressure sensing die 110, where the high pressure sensing die 112 and the low pressure sensing die 110 have respective low pressure diaphragm 105 and high pressure diaphragm 140 that are connected to each other through a center post 120 isolates the sensing circuitry from the pressure media without having to encapsulate the sensing circuitry in oil. Because the sensing circuitry is not isolated in oil, the sensing die can be fabricated at a smaller size than other pressure sensors, where the sensing circuitry is isolated in oil.

Figure 2A:
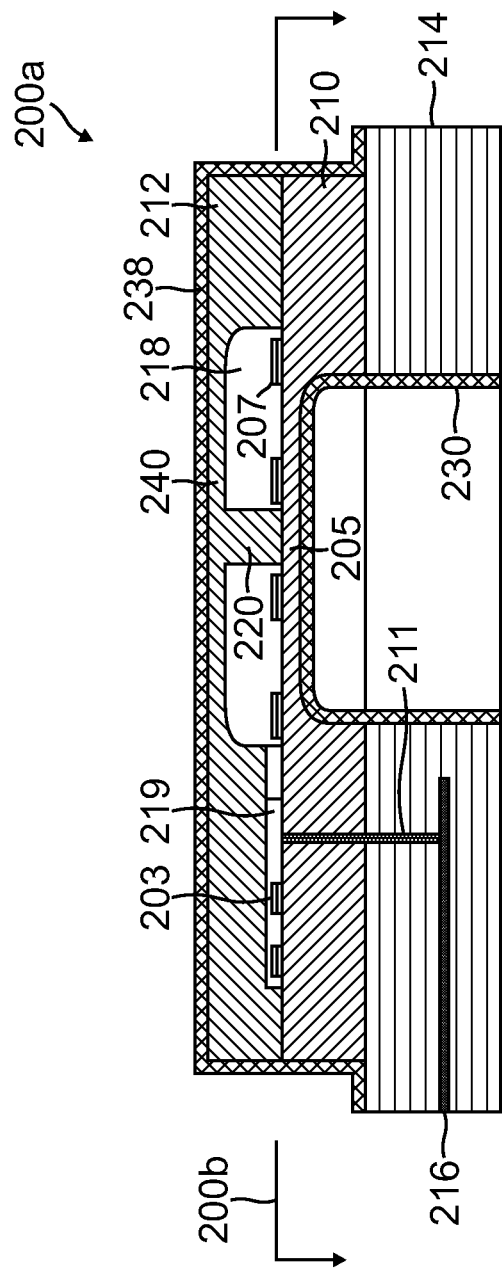
FIG. 2A is a cross sectional diagram of a two layer die stack in one embodiment described in the present disclosure.

FIG. 2A is a detailed cross section view 200a of a conjoined low pressure sensing die 210 and high pressure sensing die 212 where the low pressure sensing die 210 is mounted to a stress isolation member 214. In certain embodiments, the low pressure sensing die 210, high pressure sensing die 212, and the stress isolation member 214 function as low pressure sensing die 110, high pressure sensing die 112, and the stress isolation member 114 described in FIG. 1. Further, the low pressure sensing die 210 has sensing circuitry formed on a circuitry side 209 of the low pressure sensing die. For example, the low pressure sensing die 210 has pressure sensing elements 207 and temperature sensing elements 203. In at least one exemplary implementation, the pressure sensing elements 207 are piezo-resistive elements that are placed on top of a diaphragm 205, which diaphragm 205 is formed as part of the low pressure sensing die 210. As the diaphragm 205 moves in response to pressure differences between the high pressure media and the low pressure media, the resistance of the pressure sensing elements 207 changes accordingly. As the resistance of the pressure sensing elements 207 changes, the voltage drop across the pressure sensing elements 207 also changes when an electrical current is conducted through the pressure sensing elements 207. Because the voltage drop across the pressure sensing elements 207 changes with changes in the pressure difference between the high pressure media and the low pressure media, the voltage drop can be used to determine the pressure difference between the different media. Alternatively, either of the high pressure media or the low pressure media may function as a media providing a reference pressure (like a vacuum, or 1 atm). When one of the high pressure media or the low pressure media functions as a reference pressure, the voltage dropped across the pressure sensing elements 207 may be used to determine the absolute pressure of the measured pressure media.

In a further embodiment, a fabrication process may also form temperature sensing elements 203 on a surface of the low pressure sensing die 210. In contrast to the pressure sensing elements 207, the temperature sensing elements 203 are not formed over the diaphragm 205 but are formed on a portion of the low pressure sensing die 210 that is not on the diaphragm 205. In a manner similar to the pressure sensing elements 207, the temperature sensing elements 203 change resistance in response to effects of the environment. In particular, the temperature sensing elements 203 change resistance in response to temperature changes. Thus, temperature changes in the environment of the pressure sensor may be detected by monitoring the voltage drop across the temperature sensing elements 203.

In at least one implementation, both the temperature sensing elements 203 and the pressure sensing elements 207 electrically connect to external systems through metal traces formed on the surface of the low pressure sensing die 210, where the metal traces electrically connect the pressure sensing elements 207 and the temperature sensing elements 203 to metalized vias 211 that extend through the sensing die to contact stress isolation member traces 216. In certain embodiments the metalized vias 211 and the stress isolation member traces 216 function similarly to the stress isolation member traces 116 and metalized vias 111 as described above in relation to FIG. 1.

As the pressure sensing elements 207 and the temperature sensing elements 203 respond to strain caused by external factors, the pressure sensing elements 207 and the temperature sensing elements 203 may be protected from external environmental influences that may affect the accuracy of voltage drops measured across either the pressure sensing elements 207 and the temperature sensing elements 203. For example, if the pressure sensing elements 207, the temperature sensing elements 203, or metal traces are exposed to humidity, current may leak out of the metal traces causing the accuracy of the temperature sensing elements 203 and/or the pressure sensing elements 207 to suffer. To prevent external environmental factors from affecting the operation of either the temperature sensing elements 203 or the pressure sensing elements 207, the high pressure sensing die 212 is bonded to the low pressure sensing die 210.

As described above in relation to inner cavity 118 in FIG. 1, the high pressure sensing die 212 may have cavities formed therein to provide space for the sensing circuitry formed on the surface of the low pressure sensing die 210. For example, the high pressure sensing die 212 may include a pressure sensing cavity 218 and a temperature sensing cavity 219. The pressure sensing cavity 218 also functions to provide a diaphragm 240 formed in the high pressure sensing die 212. The pressure sensing cavity encompasses the pressure sensing elements 207 and some of the metal traces that extend from the pressure sensing elements 207 towards the metalized vias 211. The temperature sensing cavity 219 includes the temperature sensing elements 203 and a portion of the metal traces that connect to the metalized vias 211. In at least one implementation, the temperature sensing cavity 219 also includes the surface of the metalized vias 211 that connect to the metal traces on the surface of the low pressure sensing die 210. As the high pressure sensing die 212 is hermetically sealed to the low pressure sensing die 210, moisture and other damaging environmental factors are unable to enter either the temperature sensing cavity 219 or the pressure sensing cavity 218.

In at least one embodiment, where the pressure sensing cavity 218 separates the diaphragm 240 in the high pressure sensing die 212 from the diaphragm 205 in the low pressure sensing die 210, a center post 220 physically connects the facing surfaces of both diaphragms 240 and diaphragm 205 to one another. The center post 220 functions to transfer pressure forces applied to the diaphragm 240 to the low pressure diaphragm 205 and to transfer pressure forces applied to the low pressure diaphragm 205 to the high pressure diaphragm 240. By transferring forces back and forth between the low pressure diaphragm 205 and the high pressure diaphragm 240, the low pressure diaphragm 205 moves when either the low pressure diaphragm 205 or the high pressure diaphragm 240 is exposed to pressure in a pressure media. The movement of the low pressure diaphragm 205 causes strain on the pressure sensing elements 207 formed on the low pressure diaphragm 205, thus allowing the pressure sensing elements 207 to measure pressure applied to either of the high pressure diaphragm 240 or the low pressure diaphragm 205. In at least one implementation, the center post 220 attenuates the force experienced by one diaphragm as the force is transferred to the other diaphragm. For example, when the high pressure diaphragm 240 is subjected to a force, the force is transferred to the low pressure diaphragm 205 through the center post 220, where the low pressure diaphragm 205 has a quarter of the sensitivity to pressure differences in comparison to the pressure experienced by the high pressure diaphragm 240. To account for the attenuated sensitivity of the pressure sensing elements 207 mounted to the surface of the low pressure diaphragm 205, external systems adjust the measurements received from the pressure sensing circuitry 207. Also, as described above in relation to FIG. 1, once the high pressure sensing die 212 is mounted to the low pressure sensing die 210, the exposed surfaces of the high pressure sensing die 212, the low pressure sensing die 210 and the stress isolation member 214 are coated with ALD coatings 238 and 230.

Figure 2B:
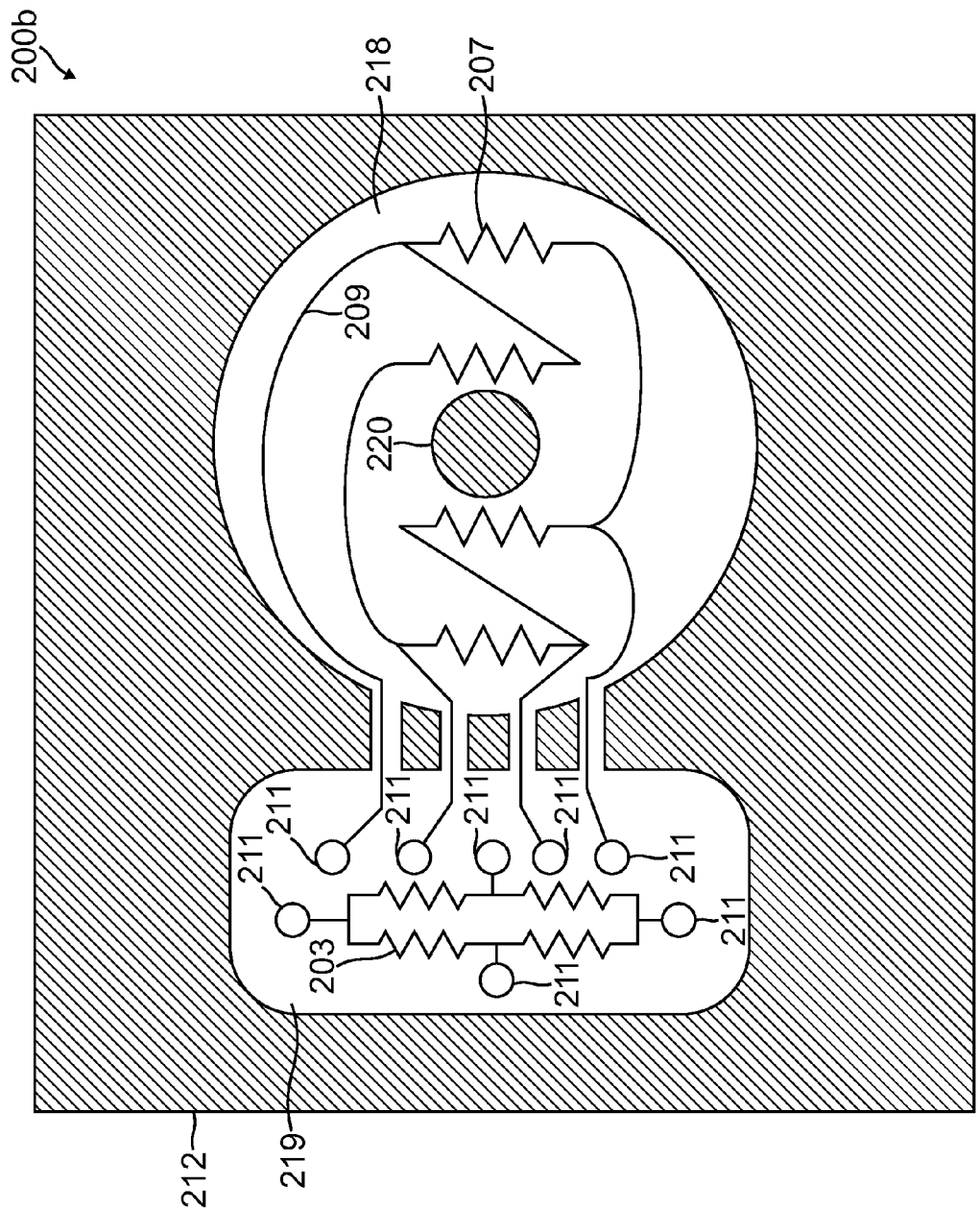
FIG. 2B is a cross sectional diagram of sensing circuitry within a two layer die stack in one embodiment described in the present disclosure.

FIG. 2B is a cross section view 200b showing the sensing circuitry formed on the surface of the low pressure sensing die 210 within pressure sensing cavity 218 and temperature sensing cavity 219. As illustrated, the pressure sensing cavity 218 and the temperature sensing cavity 219 are formed within the high pressure sensing die 212. As illustrated, the pressure sensing elements 207 may include multiple piezo-resistive elements that react to strain on the low pressure diaphragm 205. The pressure sensing elements 207 connect to the metalized vias 211 through metal traces 209 formed on the surface of the low pressure sensing die 210. As illustrated, the metal traces 209 and pressure sensing elements 207 are arranged within the pressure sensing cavity 218 around the center post 220. Further, as stated, the temperature sensing cavity 219 includes multiple temperature sensing elements 203 that react to changes in the temperature. Further, the metal traces 209 formed on the surface of the low pressure sensing die 210 connect to metalized traces 211 within the temperature sensing cavity 219.

In certain implementations where the high pressure sensing die 212 and the low pressure sensing die 210, the high pressure sensing die 212 and the low pressure sensing die 210 are fabricated by diffusion bonding together two different wafers. The separate wafers having been processed according to methods known to one having skill in the art to create the pressure sensing cavity 218 and the temperature sensing cavity 219, low pressure diaphragm 205 and high pressure diaphragm 240, pressure sensing elements 207 and temperatures sensing elements 203, metal traces 209, center post 220, and through die metalized vias 211. Using appropriate silicon processing techniques a large quantity of die can be processed at one time using two wafers, where one wafer contains multiple low pressure sensing die 210 formed therein and the other wafer contains multiple high pressure sensing die 212 formed therein. For example, when a die size 0.250×0.200 inches and each of the wafers is a 6 inch wafer, the two wafers would yield over 450 die containing both a high pressure sensing die 212 and low pressure sensing die 210 from a wafer set. In at least one implementation, the two separate wafers may be bonded to one another using a diffusion bonding process. For example, the wafer containing the multiple high pressure sensing die 212 may be bonded to the low pressure sensing die 210 using a low temperature diffusion bonding process, where the temperature is less than 600C.°. In at least one implementation, the temperature sensing elements 203 and the pressure sensing elements 207 are mounted to the low pressure sensing die using Silicon on Insulator (SOI) construction to provide isolation of the piezo-resistive elements from the conductive silicon used to form the low pressure sensing die 210.

When the different wafers are bonded to one another, the wafers may be singulated into different two layer die stacks, where each two layer die stack contains an individual high pressure sensing die 212 and low pressure sensing die 210. When the wafers are singulated, a two layer die stack is mounted to the stress isolation member 214 using various die mounting technologies. In at least one exemplary embodiment, the two layer die stack is mounted to the stress isolation member 214 using thermal electric bonding between the stress isolation member 214 and the two layer die stack.

As described above, the stress isolation member 214 is fabricated with stress isolation member traces 216 that are electrically connected to the metalized vias 211. Further, the stress isolation member traces 216 may also electrically connect to various other types of circuitry. For example, in one implementation, the stress isolation member traces 216 are electrically connected to an external connector (such as external connector 136) for sensor only applications. Alternatively, the stress isolation member traces 216 may also connect to an electronic circuit that provides signal processing, error correction, suitable electronic output and the like (such as RF front end circuitry 134).

When the different two layer die stacks are mounted to the stress isolation member 214, the surfaces of the two layer die stacks and the stress isolation member 214 are coated with an atomic layer deposition to improve the resistance of the pressure sensing device to damage that can be caused by different pressure media. In at least one implementation, the atomic layer deposition is a metal oxide. For example, the metal oxide may be $TaO_5$ coating, which coating has a tolerance to damage from media having pH ranges in the range 4-14.

The use of the two layer die stack that includes the low pressure sensing die 210 and the high pressure sensing die 212 allows for the isolation of the temperature sensing elements 203 and the pressure sensing elements 207 from damage that can be caused by certain types of pressure media without having to use oil in the isolation process. Thus, a pressure sensing device including the two layer die stack can be manufactured at a smaller size. Also, by not using oil to provide the isolation, the pressure sensing device has an increased reliability over a greater temperature range.

Figure 3:
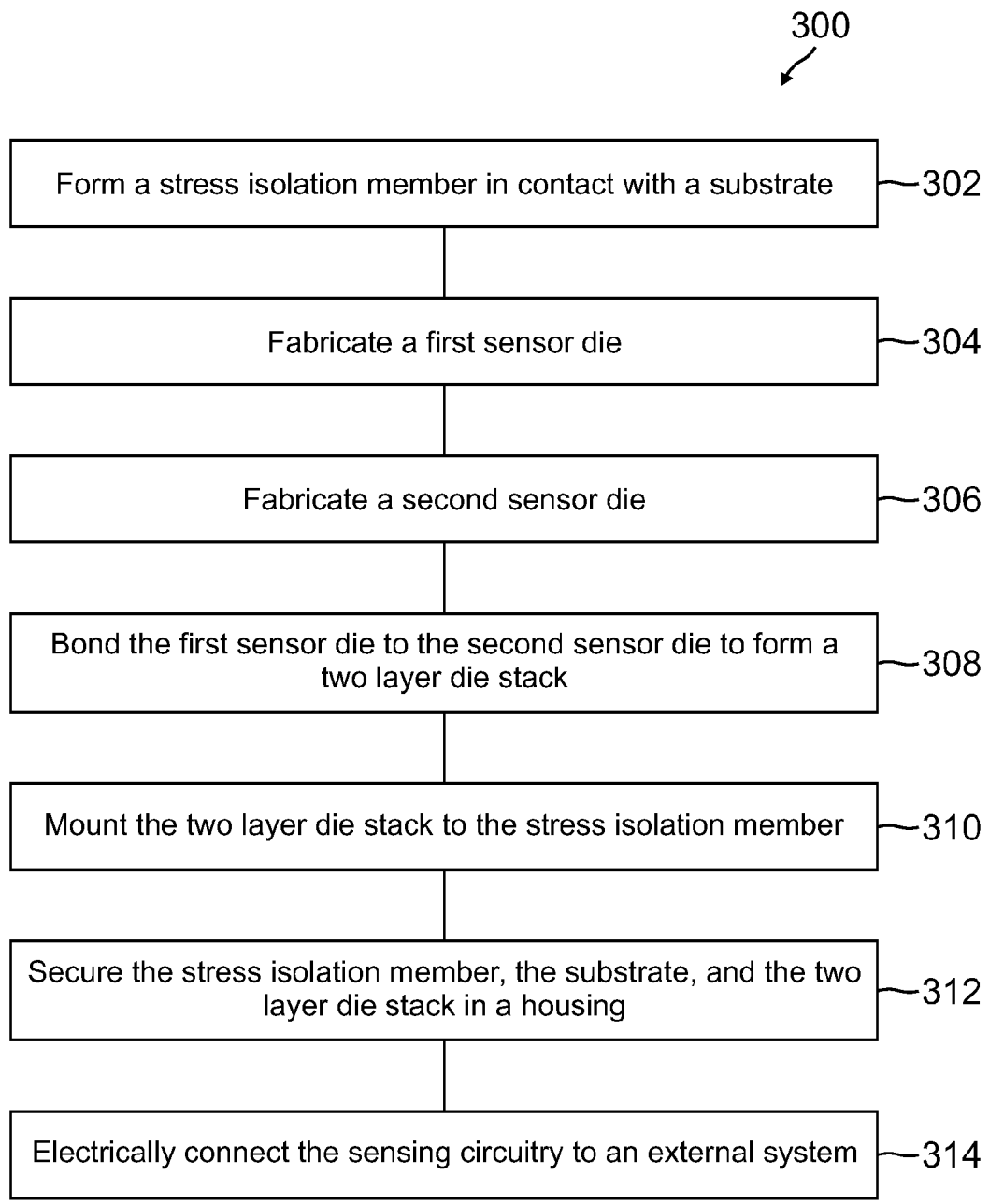
FIG. 3 is a flow diagram of a method for fabricating a pressure sensor in one embodiment described in the present disclosure.

FIG. 3 is a flow diagram of one exemplary embodiment of a method 300 for fabricating a pressure sensor. The exemplary embodiment shown in FIG. 3 is described here as being implemented using the pressure sensing device 100 shown in FIG. 1, though it is to be understood that other embodiments can be implemented in other ways.

Method 300 proceeds at 302 where a stress isolation member 114 is formed in contact with a substrate 126. In certain embodiments, the stress isolation member 114 is formed from an SM-LTCC material on a substrate 126 formed of an alumina. In at least one embodiment, a channel 138 extends through both the stress isolation member 114 and the substrate 126 such that a gaseous or liquid media can pass through the channel 138. Also, the stress isolation member 114 may be a pedestal like shape, where the channel 138 extends longitudinally through the pedestal of the stress isolation member 114.

Method 300 proceeds at 304 where a first sensor die 110 is fabricated. The first sensor die 110 includes a silicon diaphragm 105 with sensor circuitry formed on the diaphragm 105. The diaphragm 105 is formed by recessing a portion of the first sensor die 110. In at least one implementation, the sensor circuitry includes piezo-resistive elements that change resistance in accordance with movement of the diaphragm. When the first sensor die 110 is fabricated, the method 300 proceeds at 306 where a second sensor die 112 is fabricated. Like the first sensor die 110, the second sensor die 112 is formed with a diaphragm 140 by recessing a portion of the second sensor die 112. Further, the second sensor die diaphragm 140 includes a center post 120 within the recessed portion of the second sensor die 112. The method 300 then proceeds at 308 where the first sensor die 110 is bonded to the second sensor die 112 to form a two layer die stack 113. When the first sensor die 110 is bonded to the second sensor die 112, the second sensor die 112 is oriented in relation to the first sensor die 110 such that the sensor circuitry formed on the first sensor die 110 is within the recessed portion of the second sensor die 112. Further the center post 120 located within the recessed portion of the second sensor die 112 extends between diaphragm 140 and diaphragm 105. In at least one implementation, the first sensor die 110 and the second sensor die 112 are bonded together using a diffusion process to form the two layer die stack.

Method 300 proceeds at 310 where the two layer die stack 113 is mounted to the stress isolation member 114. In at least one implementation, the first sensor die 110 is mounted to the stress isolation member 114 such that the diaphragm 105 of the first sensor die 110 is exposed to an n opening of the channel 138. In at least one embodiment, the sensor circuitry on the first sensor die 110 is connected to metalized vias 111 that extend through the first sensor die 110. When the first sensor die 110 is mounted on the stress isolation member 110, the metalized vias 111 are brought into contact with embedded traces 116 formed in the stress isolation member 114, such that the sensor circuitry is electrically connected to the embedded traces 116.

In certain embodiments, method 300 proceeds to 312 where the stress isolation member 114, the substrate 126, and the two layer die stack 113 are secured in a housing. For example, the assembled components are placed within a housing that includes two parts, a low side housing 108 and high side housing 106. The low side housing 108 has a low side input port 104 and the high side housing 106 has a high side input port 102 such that high pressure media entering the high side input port 102 is able to exert pressure on the diaphragm 140 in the second sensor die 112 and low pressure media entering the low side input port 104 is able to exert pressure on the diaphragm 105 in the first sensor die 110. Further, in at least one exemplary embodiment, the assembled components are secured within the housing with a braze 128. Alternatively, the stress isolation member 114, the substrate 126, and the two layer die stack 113 are individually secured within the housing as the components are assembled together.

In certain implementations, the stress isolation member 114 and the substrate 126 can be fabricated from hygroscopic material. Also, the material in the two layer die stack 113 may be susceptible to damaging material in the pressure media. When the stress isolation member 114 and/or the substrate 126 are hygroscopic and exposed to moisture in the pressure media, the stress isolation member 114 and/or the substrate 126 can swell and cause strain in the two layer die stack 113 that causes measurement errors. Further, humidity can cause current leakage in the sensing circuitry and corrosive material in the pressure media can corrode elements within the housing. To prevent the absorption of moisture and damage, the surfaces of the components within the housing that are exposed to the either the high pressure media or the low pressure media may be coated with an atomic layer deposition 126.

In at least one implementation, method 300 proceeds to 314 where the sensing circuitry on the first sensor die 110 is electrically connected to an external system. As described above, the sensing circuitry connects to vias in the sensor die 110 which are coupled to embedded traces 116 in the stress isolation member 114. To electrically connect the sensing circuitry to an external system, the embedded traces 116 may connect to embedded traces 124 in the substrate 126 that connect to an interconnect 132 with front end circuitry 134 that connects to an external system through an external connector 136.

EXAMPLE EMBODIMENTS

Example 1 includes a method for fabricating a pressure sensor, the method comprising: forming a stress isolation member in contact with a substrate, wherein the stress isolation member and the substrate have a channel formed through the substrate and the stress isolation member; fabricating a first sensor die, the first sensor die having a first recessed portion to form a first diaphragm having sensing circuitry formed on a circuitry side of the first sensor die opposite the recessed portion; fabricating a second sensor die, the second sensor die having a second recessed portion to form a second diaphragm, wherein a center post extends from the second diaphragm into the recessed portion; bonding the first sensor die to the second sensor die to form a two layer die stack, such that the sensing circuitry is within the second recessed portion and the center post contacts the circuitry side of the first sensor die; mounting the two layer die stack to the stress isolation member, wherein the first recessed portion is exposed to the channel; securing the stress isolation member, the substrate, and the two layer die stack in a housing having a high side input port and a low side input port, wherein the channel is positioned in the housing such that a low pressure media entering the low side input port also enters the channel and a high pressure media entering the high side input port exerts a direct force on the second diaphragm; and electrically connecting the sensing circuitry to an external system.

Example 2 includes the method of Example 1, wherein the stress isolation member comprises a pedestal, the pedestal extending away from a surface of the substrate, wherein the channel extends longitudinally through the pedestal, the sensor die being mounted to the pedestal, wherein the opening of the channel exposed to the first side of the first diaphragm is in a side of the pedestal that is farthest from the substrate.

Example 3 includes the pressure sensor of any of Examples 1-2, wherein bonding the first sensor die to the second sensor die comprises using a diffusion bonding process.

Example 4 includes the method of any of Examples 1-3, wherein forming the stress isolation member on the substrate comprises forming at least one embedded conductive trace within the stress isolation member, wherein the at least one embedded conductive trace electrically connect to the sensing circuitry.

Example 5 includes the method of Example 4, wherein fabricating the first sensor die comprises forming at least one via through the first sensor die, wherein the at least one via electrically connects the at least one embedded conductive trace to the sensing circuitry when the two layer die stack is mounted to the stress isolation member.

Example 6 includes the method of any of Examples 1-5, wherein the stress isolation member is fabricated from a silicon coefficient of thermal expansion matching low temperature co-fired ceramic.

Example 7 includes the method of any of Examples 1-6, further comprising applying a low side atomic layer deposition to low side surfaces of the substrate, the stress isolation member, and the two layer die stack, wherein the low side surfaces are exposed to the low side input port and applying a high side atomic layer deposition to high side surfaces of the stress isolation member and the two layer die stack, wherein the high side surfaces are exposed to the high side input port.

Example 8 includes the method of Example 7, wherein the atomic layer deposition comprises a metal oxide.

Example 9 includes the method of any of Examples 7-8, wherein securing the stress isolation member, the substrate, and the two layer die stack in the housing comprises: mounting the stress isolation member, the substrate and the two layer die stack within a low side housing, the low side housing comprising the low side input port; applying the low side atomic layer deposition; applying the high side atomic layer deposition; and joining a high side housing to the low side housing to form the housing, the high side housing comprising the high side input port.

Example 10 includes the method of any of Examples 1-9, wherein electrically connecting the sensing circuitry to an external system comprises: electrically connecting the sensing circuitry to front end circuitry located within a circuit housing, wherein the circuit housing is mounted to an external surface of the housing; electrically connecting the front end circuitry to the external system through an external connector.

Example 11 includes the method of any of Examples 1-10, wherein the substrate and the stress isolation member are secured within the housing with at least one of a braze and a solder joint.

Example 12 includes a pressure sensor, the sensor comprising: a housing comprising a high side input port configured to allow a high pressure media to enter a high side of the interior of the housing and a low side input port configured to allow a low pressure media to enter a low side of the interior of the housing when the housing is placed in an environment containing the high pressure media and the low pressure media; a substrate securely mounted within the housing; a stress isolation member mounted to the substrate, wherein a channel extends from an end of the low side input port through the substrate and the stress isolation member, wherein at least one trace is embedded within the stress isolation member; a two layer die stack bonded to the stress isolation member, the two layer die stack comprising: a first sensor die, the first sensor die having a first recessed portion to form a first diaphragm having sensing circuitry formed on a circuitry side of the first sensor die opposite the recessed portion; a second sensor die, the second sensor die having a second recessed portion to form a second diaphragm, wherein a center post extends from the second diaphragm into the recessed portion; and at least one via extending through the first sensor die, the at least one via electrically connecting the sensing circuitry to the at least one trace; a low side atomic layer deposition applied to surfaces of the substrate, the stress isolation member and the two layer die stack that are exposed to the low side input port; and a high side atomic layer deposition applied to surfaces of the stress isolation member and the two layer die stack that are exposed to the high side input port.

Example 13 includes the pressure sensor of Example 12, wherein the sensing circuitry comprises: at least one temperature sensing element; and at least one pressure sensing element.

Example 14 includes the pressure sensor of Example 13, wherein the at least one pressure sensing elements are located within the second recessed portion on the circuitry side of the first diaphragm and the at least one temperature sensing elements are located within a temperature sensing cavity in the second sensor die on a portion of the circuitry side of the first sensor die that is not opposite the first recessed portion.

Example 15 includes the pressure sensor of Example 14, wherein the at least one via connects to metal traces within the temperature sensing cavity, wherein the metal traces connect to the at least one pressure sensing elements and the at least one temperature sensing elements.

Example 16 includes the pressure sensor of any of Examples 12-15, wherein the first sensor die is bonded to the second sensor die with a diffusion bonding process.

Example 17 includes the pressure sensor of any of Examples 12-16, wherein the housing comprises: a low side housing, the low side housing comprising the low side input port, wherein the stress isolation member and the substrate are securely mounted within the low side housing; and a high side housing, the high side housing comprising the high side input port, wherein the high side housing is hermetically joined to the low side housing.

Example 18 includes a pressure sensor, the sensor comprising: a housing comprising a high side input port configured to allow a high pressure media to enter a high side of the interior of the housing and a low side input port configured to allow a low pressure media to enter a low side of the interior of the housing when the housing is placed in an environment containing the high pressure media and the low pressure media; a substrate securely mounted within the housing; a stress isolation member mounted to the substrate, wherein a channel extends from an end of the low side input port through the substrate and the stress isolation member; a two layer die stack bonded to the stress isolation member, the two layer die stack comprising isolated sensing circuitry; a low side atomic layer deposition applied to surfaces of the substrate, the stress isolation member and the two layer die stack that are exposed to the low side input port; and a high side atomic layer deposition applied to surfaces of the stress isolation member and the two layer die stack that are exposed to the high side input port.

Example 19 includes the pressure sensor of Example 18, wherein the two layer die stack comprises a first sensor die, the first sensor die having a first recessed portion to form a first diaphragm having sensing circuitry formed on a circuitry side of the first sensor die opposite the recessed portion; a second sensor die, the second sensor die having a second recessed portion to form a second diaphragm, wherein a center post extends from the second diaphragm into the recessed portion; and at least one via extending through the first sensor die, the at least one via electrically connecting the sensing circuitry to at least one trace formed in the stress isolation member.

Example 20 includes the pressure sensor of any of Examples 18-19, wherein the two layer die stack is thermo-electrically bonded to the stress isolation member.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

Terms of relative position as used in this application are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the wafer or substrate, regardless of the orientation of the wafer or substrate.

What is claimed is:

1. A pressure sensor, the sensor comprising:
   a housing comprising a high side input port configured to allow a high pressure media to enter a high side of the interior of the housing and a low side input port configured to allow a low pressure media to enter a low side of the interior of the housing when the housing is placed in an environment containing the high pressure media and the low pressure media;
   a substrate securely mounted within the housing;
   a stress isolation member mounted to the substrate, wherein a channel extends from an end of the low side input port through the substrate and the stress isolation member, wherein at least one trace is embedded within the stress isolation member;
   a two layer die stack bonded to the stress isolation member, the two layer die stack comprising:
      a first sensor die, the first sensor die having a first recessed portion to form a first diaphragm having sensing circuitry formed on a circuitry side of the first sensor die opposite the recessed portion;
      a second sensor die, the second sensor die having a second recessed portion to form a second diaphragm, wherein a center post extends from the second diaphragm into the recessed portion; and
      at least one via extending through the first sensor die, the at least one via electrically connecting the sensing circuitry to the at least one trace;
   a low side atomic layer deposition applied to surfaces of the substrate, the stress isolation member and the two layer die stack that are exposed to the low side input port; and
   a high side atomic layer deposition applied to surfaces of the stress isolation member and the two layer die stack that are exposed to the high side input port.

2. The pressure sensor of claim 1, wherein the sensing circuitry comprises:
   at least one temperature sensing element; and
   at least one pressure sensing element.

3. The pressure sensor of claim 2, wherein the at least one pressure sensing elements are located within the second recessed portion on the circuitry side of the first diaphragm and the at least one temperature sensing elements are located within a temperature sensing cavity in the second sensor die on a portion of the circuitry side of the first sensor die that is not opposite the first recessed portion.

4. The pressure sensor of claim 3, wherein the at least one via connects to metal traces within the temperature sensing cavity, wherein the metal traces connect to the at least one pressure sensing elements and the at least one temperature sensing elements.

5. The pressure sensor of claim 1, wherein the first sensor die is bonded to the second sensor die with a diffusion bonding process.

6. The pressure sensor of claim 1, wherein the housing comprises:
- a low side housing, the low side housing comprising the low side input port, wherein the stress isolation member and the substrate are securely mounted within the low side housing; and
- a high side housing, the high side housing comprising the high side input port, wherein the high side housing is hermetically joined to the low side housing.

7. A pressure sensor, the sensor comprising:
- a housing comprising a high side input port configured to allow a high pressure media to enter a high side of the interior of the housing and a low side input port configured to allow a low pressure media to enter a low side of the interior of the housing when the housing is placed in an environment containing the high pressure media and the low pressure media;
- a substrate securely mounted within the housing;
- a stress isolation member mounted to the substrate, wherein a channel extends from an end of the low side input port through the substrate and the stress isolation member;
- a two layer die stack bonded to the stress isolation member, the two layer die stack comprising isolated sensing circuitry;
- a low side atomic layer deposition applied to surfaces of the substrate, the stress isolation member and the two layer die stack that are exposed to the low side input port; and
- a high side atomic layer deposition applied to surfaces of the stress isolation member and the two layer die stack that are exposed to the high side input port.

8. The pressure sensor of claim 7, wherein the two layer die stack comprises
- a first sensor die, the first sensor die having a first recessed portion to form a first diaphragm having sensing circuitry formed on a circuitry side of the first sensor die opposite the recessed portion;
- a second sensor die, the second sensor die having a second recessed portion to form a second diaphragm, wherein a center post extends from the second diaphragm into the recessed portion; and
- at least one via extending through the first sensor die, the at least one via electrically connecting the sensing circuitry to at least one trace formed in the stress isolation member.

9. The pressure sensor of claim 7, wherein the two layer die stack is thermoelectrically bonded to the stress isolation member.

* * * * *